United States Patent
Budai (10) Patent No.: US 8,363,412 B2
(45) Date of Patent: Jan. 29, 2013

(54) MOTHER AND DAUGHTER BOARD CONFIGURATION TO IMPROVE CURRENT AND VOLTAGE CAPABILITIES OF A POWER INSTRUMENT

(75) Inventor: James Budai, Fort Collins, CO (US)

(73) Assignee: IXYS Corporation, Milpitas, CA (US)

( * ) Notice: Subject to any disclaimer, the term of this patent is extended or adjusted under 35 U.S.C. 154(b) by 33 days.

(21) Appl. No.: 12/732,080

(22) Filed: Mar. 25, 2010

(65) Prior Publication Data

US 2011/0235271 A1    Sep. 29, 2011

(51) Int. Cl.
*H05K 7/20* (2006.01)

(52) U.S. Cl. .............. 361/720; 361/679.48; 361/679.52; 361/679.54; 361/695; 361/697; 361/699; 361/702; 361/704; 361/719; 165/104.33; 165/185; 363/141

(58) Field of Classification Search ........ 165/80.2–80.4, 165/104.33, 185; 363/141; 361/679.47–679.5, 361/679.53–679.54, 690, 694–695, 697, 361/699, 702–704, 709–710, 719–721, 788
See application file for complete search history.

(56) References Cited

U.S. PATENT DOCUMENTS

| 5,398,161 | A  | * | 3/1995  | Roy ............................... 361/727 |
| 5,721,458 | A  | * | 2/1998  | Kearney et al. ............... 307/150 |
| 6,069,797 | A  | * | 5/2000  | Widmayer et al. ............ 361/760 |
| 6,478,082 | B1 | * | 11/2002 | Li .................................. 165/185 |
| 6,710,621 | B2 | * | 3/2004  | Devlin et al. .................. 326/38 |
| 7,278,853 | B1 | * | 10/2007 | Brodsky ......................... 439/60 |
| 7,286,355 | B2 | * | 10/2007 | Cheon ........................... 361/699 |
| 7,534,110 | B2 | * | 5/2009  | Brodsky ......................... 439/60 |
| 7,652,880 | B2 | * | 1/2010  | Wayman ....................... 361/690 |

* cited by examiner

*Primary Examiner* — Robert J Hoffberg
(74) *Attorney, Agent, or Firm* — Kilpatrick Townsend & Stockton LLP (57) ABSTRACT

An arrangement of a mother circuit board and daughter circuit boards in a power instrument improves current and voltage capabilities. A mother board is mounted to a base panel of an enclosure, and a number of daughter boards are attached to and extend from the mother board. Each daughter board has substantially identical circuitry and produces substantially the same amount of current. The daughter boards together provide a total output current equal to a sum of each individually generated current. The amount of power generated by the instrument can be increased by attaching additional daughter boards to the mother board. The total current produced by the daughter boards is provided to and output from the mother board via a low inductance output path. The low inductance output path ensures that a sudden increase in current does not result in a large voltage spike that adversely affects instrument operation.

17 Claims, 7 Drawing Sheets

MOTHER AND DAUGHTER BOARD CONFIGURATION TO IMPROVE CURRENT AND VOLTAGE CAPABILITIES OF A POWER INSTRUMENT

TECHNICAL FIELD

This invention relates to a power instrument, and more particularly to a power instrument including an arrangement of a mother circuit board and daughter circuit boards to improve current and voltage capabilities.

BACKGROUND OF THE INVENTION

Electronic semiconductor instrument technology continues to rapidly advance, producing instruments that achieve heretofore unattainable operating speeds, component packing density, and high-temperature operation. In high power instrument, many issues must be addressed to ensure proper instrument operation. These issues include lack of real estate for the electronics, high temperatures generated by power components, and a high inductance output path due to the orientation of the components.

In an effort to conserve circuit board space, many power instruments include a number of daughter boards mounted on a mother board. The daughter boards are different from each other and are configured to provide the power instrument with different capabilities. For example, a first daughter board may be configured to provide a large output current, while a second daughter board may be configured to include a controller for controlling current generation of the first daughter board. Since the daughter boards are different from each other, the implementation of design modifications becomes problematic because each daughter board may be differently affected by a single design modification.

The description below provides solutions to the various issues related to a mother and daughter board configuration in power instrument.

BRIEF SUMMARY OF THE INVENTION

The present invention provides an arrangement of a mother circuit board and daughter circuit boards in a power instrument to improve current and voltage capabilities. A mother board is mounted to a base panel of an enclosure, and a number of daughter boards are attached to and extend from the mother board. Each daughter board has substantially identical circuitry and produces substantially the same amount of current. The daughter boards together provide a total output current equal to a sum of each individually generated current. The amount of power generated by the instrument can be increased by attaching additional daughter boards to the mother board. The total current produced by the daughter boards is provided to and output from the mother board via a low inductance output path. The low inductance output path ensures that a sudden increase in current does not result in a large voltage spike that adversely affects instruments operation.

In accordance with embodiments of the invention a power instrument includes a motherboard attached to an enclosure and a plurality of daughter boards. The mother board includes a low inductance output path coupled to an output connector. Each daughter board includes substantially the same circuitry such that each daughter board generates substantially the same amount of current. The circuitry of each daughter board includes at least one heat generating electronic component. Each daughter board provides the current generated to the mother board. The mother board outputs a total current substantially equal to a sum of each current generated by each daughter board through the output connector via the low inductance output path.

A further understanding of the nature and advantages of the present invention may be realized by reference to the remaining portions of the specification and the drawings.

DETAILED DESCRIPTION OF THE INVENTION

The present invention provides an arrangement of a mother circuit board and daughter circuit boards in a power instrument to improve current and voltage capabilities. A mother board is mounted to a base panel of an enclosure, and a number of daughter boards are attached to and extend from the mother board. Each daughter board has substantially identical circuitry and produces substantially the same amount of current. The daughter boards together provide a total output current equal to a sum of each individually generated current. The amount of power generated by the instrument can be increased by attaching additional daughter boards to the mother board. The total current produced by the daughter boards is provided to and output from the mother board via a low inductance output path. The low inductance output path ensures that a sudden increase in current does not result in a large voltage spike that adversely affects instrument operation.

Figure 1:
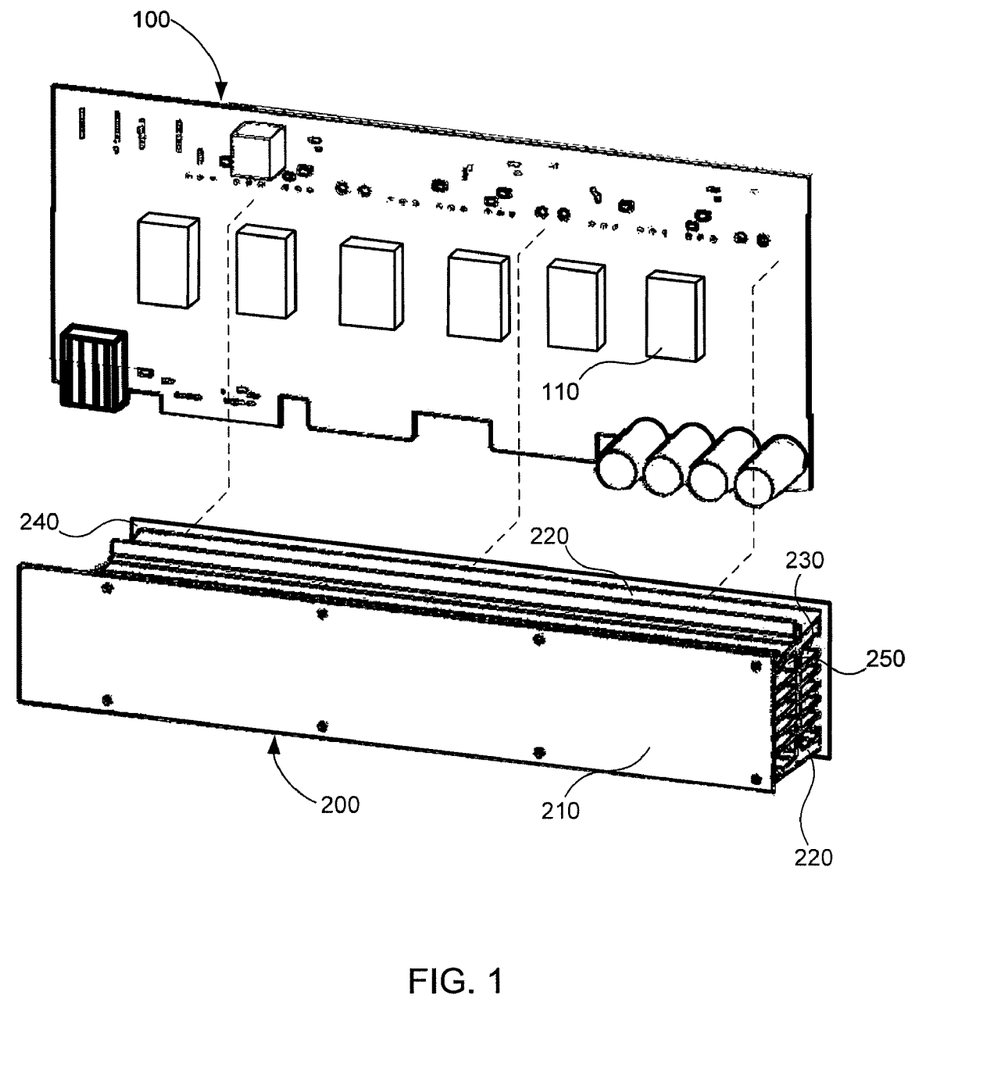
FIG. 1 is a perspective view of a heatsink and a daughter board in accordance with embodiments of the present invention.
Figure 2:
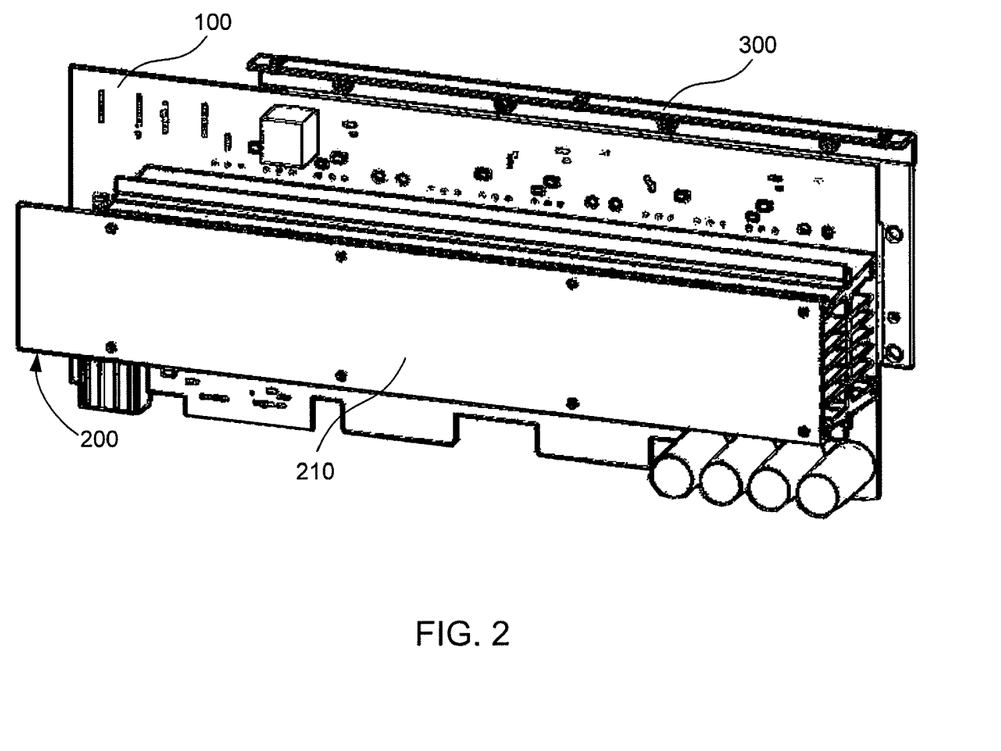
FIG. 2 is a perspective view of the heatsink attached to the daughter board in accordance with embodiments of the present invention.

FIG. 1 is a perspective view of a heatsink 200 and a daughter board 100, and FIG. 2 is a perspective view of the heatsink 200 attached to the daughter board 100, in accordance with embodiments of the present invention. The daughter board 100 includes several electronic components mounted thereon and interconnected with each other. The daughter board 100 provides an extension of the functionality of a mother board (shown in FIG. 3).

Most electronic components generate heat during operation. Some devices (e.g., voltage regulators, computer processors, power generators, etc.) generate so much heat that the instrument would be destroyed unless the heat is removed. The electronic components provided on the daughter board 100 include heat generating electronic components 110 provided on one side of the daughter board. The heat generating electronic components 110 generate an amount of heat that requires thermal dissipation to prevent an adverse affect on instrument operation. Examples of the heat generating electronic components 110 include resistors, FETs, inductors, transformers, transistors, and the like.

The heat generating electronic components 110 shown in FIG. 1 are illustrated as integrated circuit chips that are packaged to include the heat generating electronic components 110 (e.g., hundreds or thousands of field effect transistors included in one integrated circuit chip). However, as one having ordinary skill in the art would appreciate, the heat generating electronic components may be any component that requires thermal dissipation to ensure proper operation. Additional electronic components may be mounted on an opposite side of the daughter board. For example, the additional electronic components may be mounted on a circuit board 300 to be attached to the daughter board 100. The additional electronic components may or may not generate heat that requires thermal dissipation.

The heatsink 200 is constructed of thermally conductive material (e.g., a metal such as copper or aluminum alloy). The heatsink 200 includes a planar, elongate base 210, two side plates 220 orthogonally extending from upper and lower longitudinal edges of the base 210, and a plurality of fins 230 that extend orthogonally from the base 210 between the side plates 220. The fins 230 are attached to the base 210 such that the fins 230 extend from the base 210 in a longitudinal direction of the heatsink 200. As a result, spaces between the fins 230 are provided along the longitudinal direction of the heatsink 200 and are exposed to the lateral sides of the heatsink 200. The spaces between the fins 230 may also be exposed to a side of the heatsink 200 opposite the base 210 (i.e., the side facing the daughter board 100). However, as one having ordinary skill in the art would appreciate, the fins 230 may also be attached to a contact plate 240 provided between the two side plates 220 on the opposite side of the heatsink 200 from the base 210. In some embodiments, the heatsink 200 includes a planar spine 250 that extends between the two side plates 220 and intersects the fins 230 in order to provide structural support for the heatsink 200 and to increase the overall heat dissipation surface area of the heatsink 200.

As shown in FIG. 2, the heatsink 200 is attached to the daughter board 100 by any number of conventional means known in the art (e.g., a nut and bolt combination, thermal adhesive, a clamping mechanism, etc.). The heatsink 200 is attached to the daughter board 100 such that the heat generating electronic components 110 are thermally coupled to the heatsink 200. For example, an outer surface of the heat generating electronic components 110 contacts the fins 230 or the contact plate 240 of the heatsink 200. As a result, the heatsink 200 increases the heat dissipating surface area of the heat generating electronic components 110.

In accordance with embodiments of the invention, when the heatsink 200 is attached to the daughter board 100, an air passage is created in the heatsink 200 between the base 210, the side plates 220, the fins 230 and the daughter board 100 (or the contact plate 240). As described in detail below, the flow of air can be directed into the air passage from one exposed lateral side of the heatsink 200 through the spaces between the fins 230 and out of the opposite exposed lateral side of the heatsink 200. As a result, heat dissipated from the heat generating electronic components 110 that is provided to the heatsink 200 is directed out of and away from the heatsink 200. In accordance with embodiments of the invention, the heat dissipated from the heat generating electronic components 110 may be removed via a liquid cooling system (as described below) rather than the heatsink/fan combination.

Figure 3:
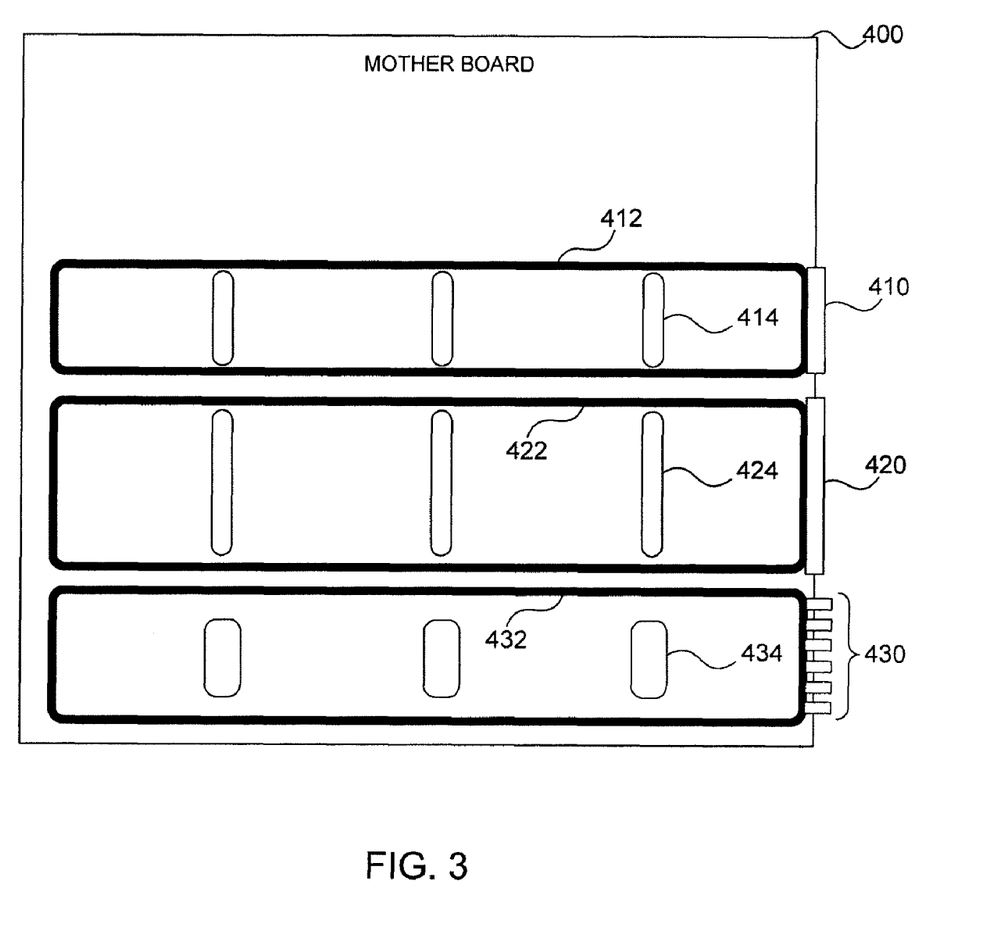
FIG. 3 is a top view of a mother board in accordance with embodiments of the present invention.

FIG. 3 is a top view of a mother board 400 in accordance with embodiments of the present invention. The mother board 400 includes an input connector 410, an output connector 420, and control pins 430. The mother board 400 also includes an input path 412 coupled to the input connector 410, an output path 422 coupled to the output connector 420, and a control path 432 coupled to the control pins 430. The mother board 400 further includes daughter board connectors 414, 424, 434. Data and electrical power are transferred between the mother board 400 and the daughter boards 100 attached thereto via the daughter board connectors 414, 424, 434.

Input power from the input connector 410 is provided to the mother board 400 and the daughter boards 100 by the input path 412. Output from the daughter boards 100 and the mother board 400 is provided to the output connector 420 via the output path 422. The control path 432 is coupled to a control circuit for controlling operation of the instrument.

In accordance with embodiments of the invention, the output path 422 is a low inductance path. A low inductance path is necessary to ensure proper operation of the instrument. For example, if the instrument is a high current pulser, an increase in current from 0 to 600 Amperes causes a large voltage spike if the output path is a high inductance path. The output path 422 may be formed on both sides of the mother board 400 as a solid copper trace approximately 7.5 cm wide. A wider copper trace would further lower the inductance of the output path.

Figure 4:
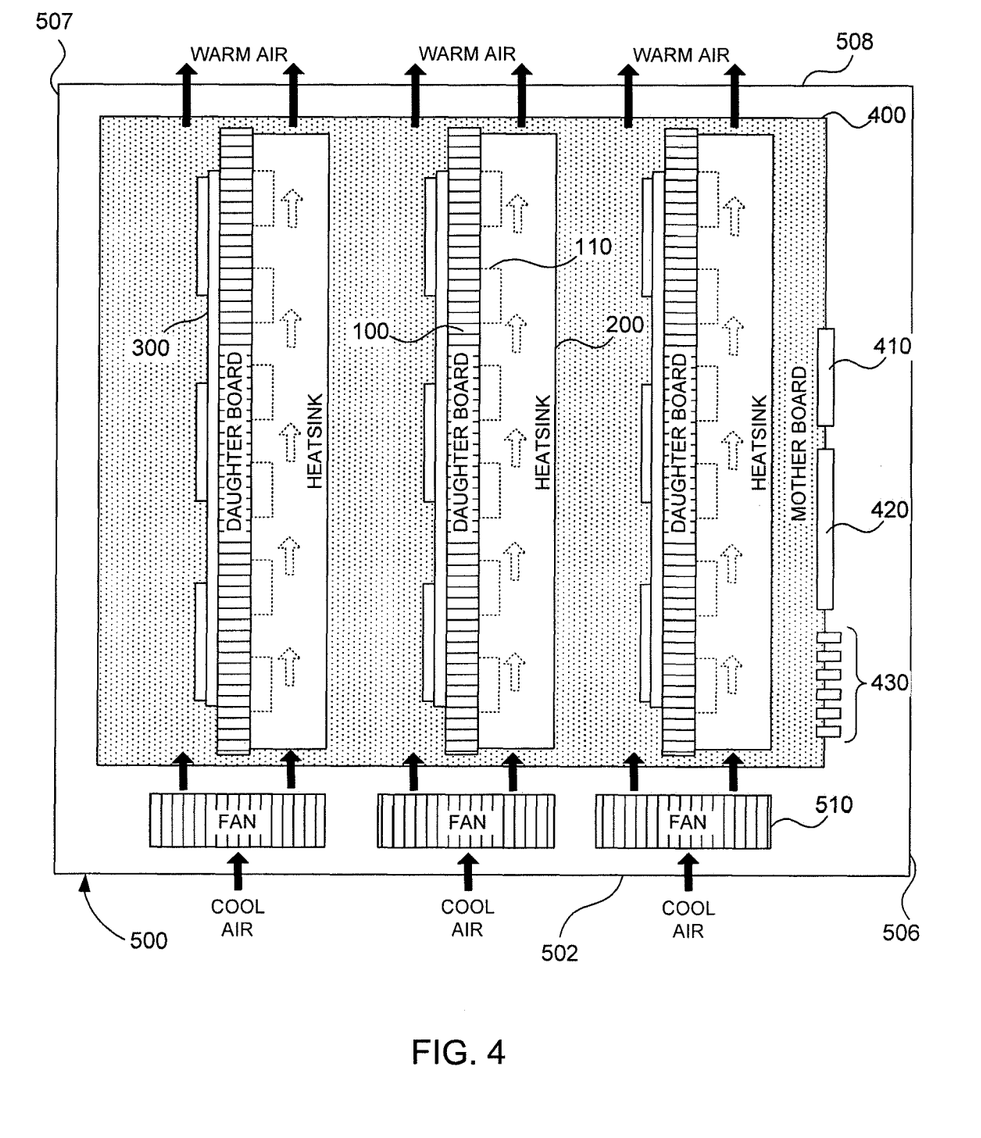
FIG. 4 is top view of a power instrument including three daughter boards mounted on a mother board and a heatsink/fan combination in accordance with embodiments of the present invention.
Figure 5:
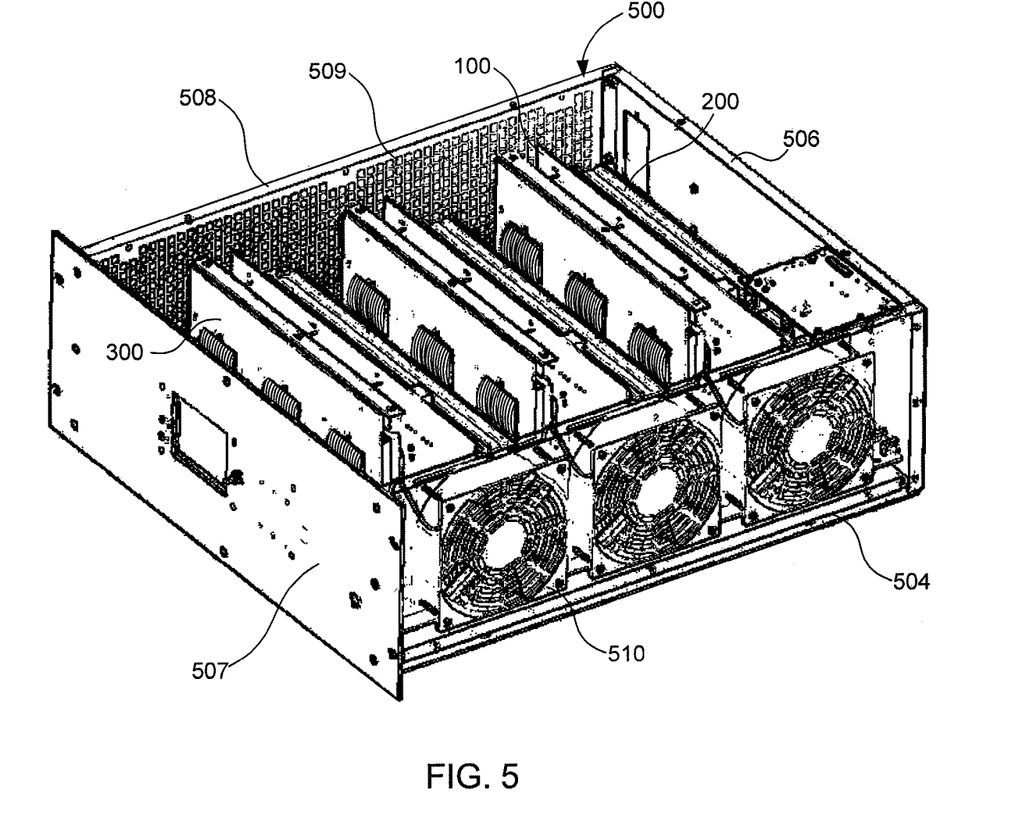
FIG. 5 is a perspective view of the power instrument with a top panel removed to expose an interior of the power instrument in accordance with embodiments of the present invention.

FIG. 4 is top view of a power instrument including three daughter boards 100 mounted on a mother board 400, and FIG. 5 is a perspective view of the power instrument with a top panel removed to expose an interior of the power instrument, in accordance with embodiments of the present invention. The instrument includes an enclosure 500 having a side face 502. The enclosure 500 includes a base panel 504. A front panel 507 and a rear panel 506 are respectively attached to opposite lateral edges of the base panel 504, and a side panel 508 is attached to the base panel 504, the front panel 507 and the rear panel 506. A plurality of vents 509 are formed in the side panel 508.

The mother board 400 is mounted within the enclosure 500 on the base panel 504. Three daughter boards 100 are attached to the mother board 400. In one embodiment, the three daughter boards 100 are identical. For example, in a high current output driver, each daughter board 100 has identical circuitry to provide the same amount of current (e.g., 200 Amperes). As a result, the three daughter boards 100 together can provide a total output current equal to the sum of each individual current (e.g., 600 Amperes). As one having ordinary skill in the art would appreciate, the amount of power generated by the instrument can be increased by attaching additional daughter boards 100 to the mother board 400. The identical daughter boards facilitates design modification of the power instrument by merely requiring the replacement of the daughter boards with modified daughter boards having identical circuitry without requiring a modification to the mother board 400 or other power instrument components.

Each daughter board 100 includes the heatsink 200 thermally coupled to the heat generating electronic components 110, and may also include the circuit board 300 having additional electronic components mounted thereon. Each daughter board 100 is attached to the corresponding daughter board connectors 414, 424, 434 such that each daughter board 100 extends orthogonally from the mother board 400. Each daughter board 100 extends proximate the side face 502 of the enclosure 500 toward the side panel 508 such that the daughter boards 100 are substantially parallel to the front panel 507 and the rear panel 506.

Three fans 510 are mounted to the base panel 504 at the side face 502 of the enclosure 500. Each fan 510 is aligned with a corresponding daughter board 100. When the fans 510 are powered up, cool air external to the enclosure 500 is drawn into the side face 502 of the enclosure 500. The fans 510 are configured to provide cool air to the exposed side portion of the heatsink 200 proximate the side face 502 of the enclosure 500. The cool air passes through the air passage defined in the heatsink 200 between the base 210, the side plates 220, the fins 230, and the daughter board 100 (or the contact plate 240). The cool air is warmed by heat from the heatsink 200 (i.e., heat dissipated from the heat generating electronic components 110), and the warm air exits the heatsink 200 at an opposite exposed side portion proximate the side panel 508. The warm air then exits the enclosure 500 through the vents 509 formed in the side panel 508. As a result, the interior temperature of the power instrument can be maintained at a level that does not adversely impact operation of the instrument because heated air is not continuously re-circulated in the enclosure 500.

Figure 6:
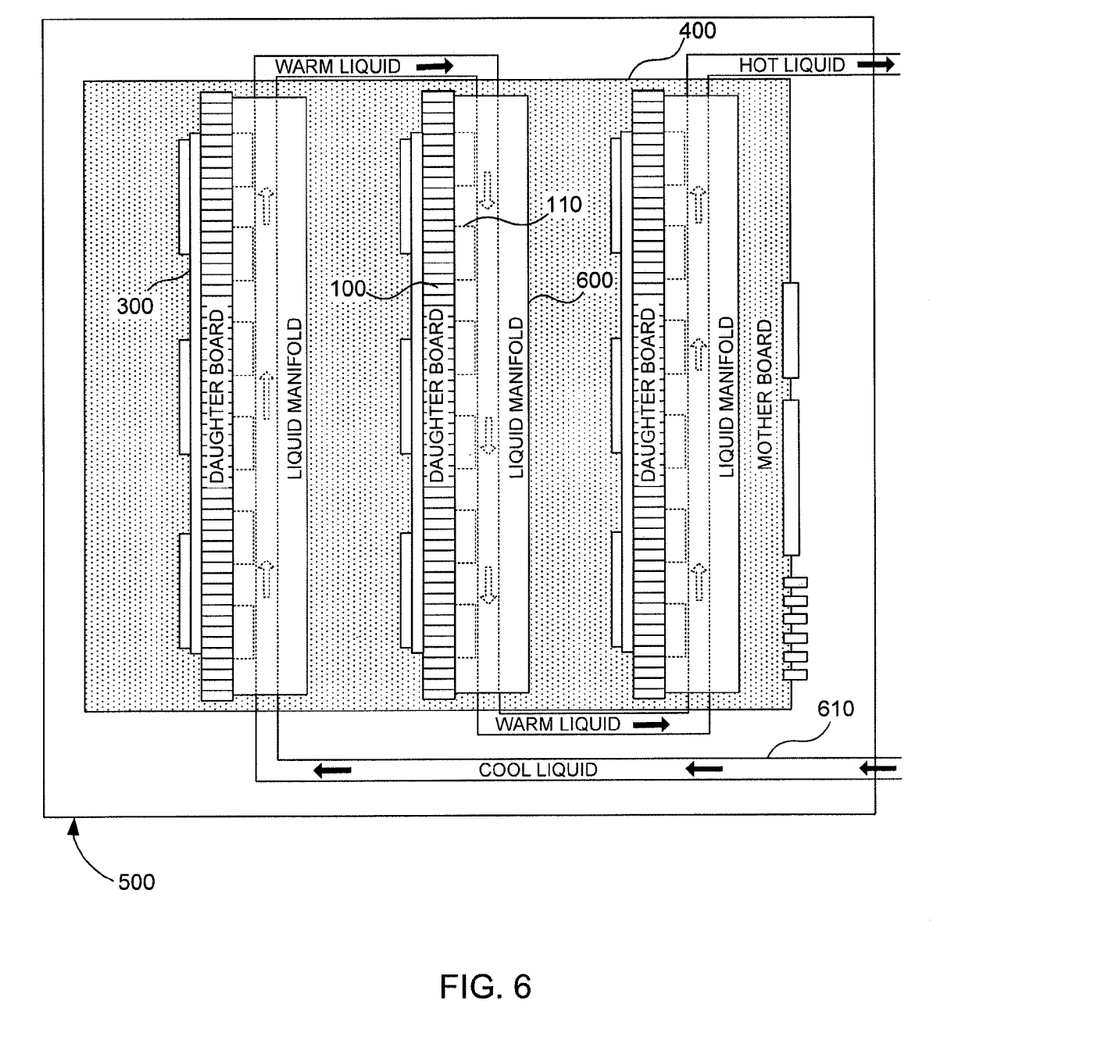
FIG. 6 is top view of a power instrument including three daughter boards mounted on a mother board and a liquid cooling system in accordance with embodiments of the present invention.
Figure 7:
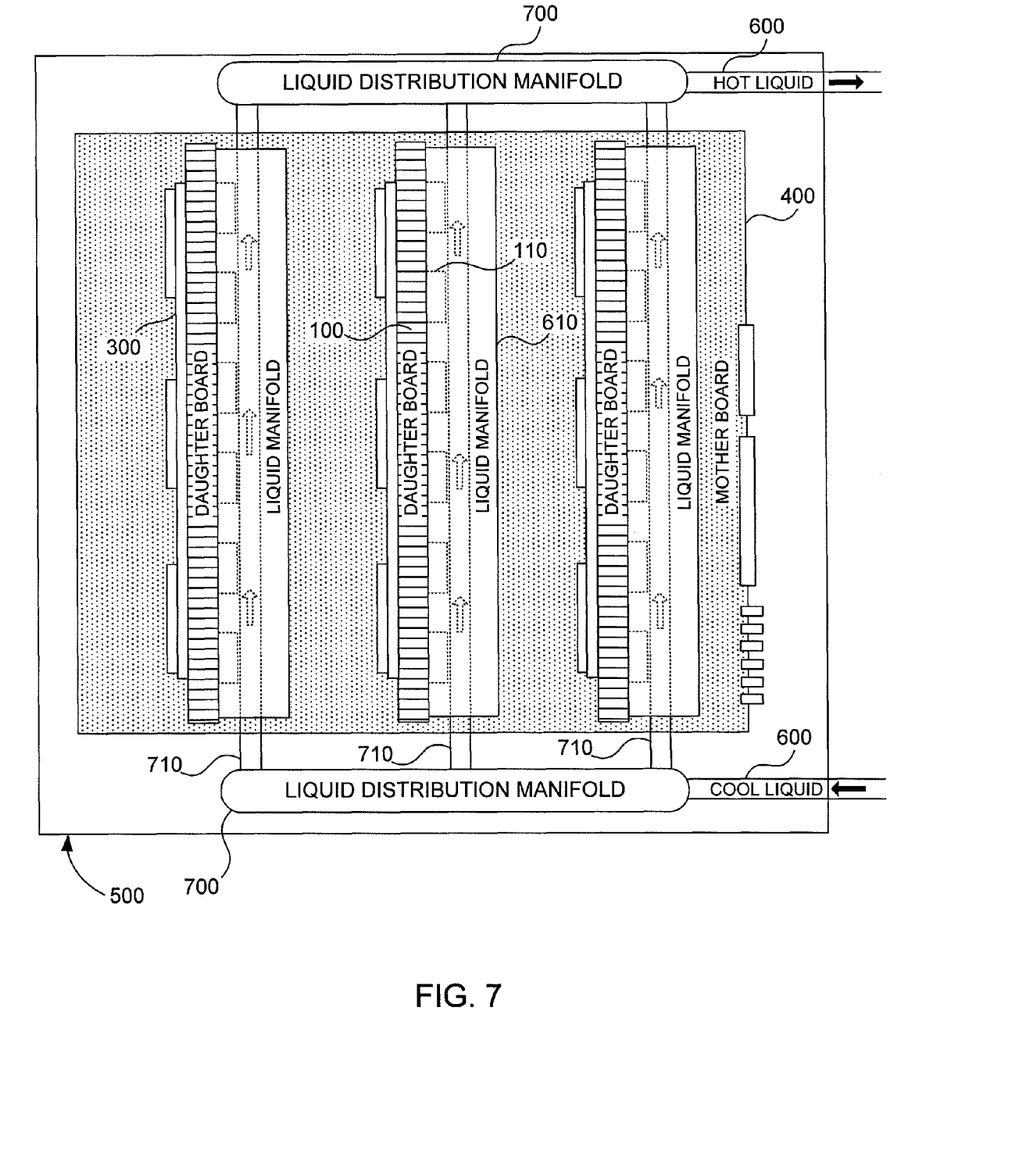
FIG. 7 is top view of a power instrument including three daughter boards mounted on a mother board and a liquid cooling system in accordance with embodiments of the present invention.

FIGS. 6 and 7 are both top views of a power instrument including three daughter boards mounted on a mother board and a liquid cooling system in accordance with embodiments of the present invention. Referring to FIG. 6, the liquid cooling system includes a liquid manifold 610 thermally coupled to the heat generating electronic components 110, and a liquid line 600 that passes through an interior of each liquid manifold 610. Accordingly, the liquid line 600 is thermally coupled to the heat generating electronic components 110 of the corresponding daughter board 100. When the liquid cooling system is in operation, cool liquid begins to circulate in the liquid line 600. The liquid is warmed by heat dissipated by the heat generating electronic components 110 of each daughter board 100 and eventually exits the system as hot liquid. Cool liquid is continually entered into the system via the liquid line 600 such that the hot liquid is replaced with cool liquid in the liquid line 600. As a result, the interior temperature of the power instrument can be maintained at a level that does not adversely impact operation of the instrument.

Referring to FIG. 7, which illustrates another embodiment of the liquid cooling system, the liquid line 600 is coupled to a pair of liquid distribution manifolds 700. Additional liquid lines 710 are coupled between the liquid distribution manifolds 700 such that each additional liquid line is thermally coupled to the heat generating electronic components 110 of each daughter board 100. When the liquid cooling system is in operation, cool liquid begins to circulate in the liquid line 600 and enters the first liquid distribution manifold 700. The cool liquid exits the liquid distribution manifold 710 via each additional liquid line. The liquid in each additional liquid line 710 is warmed by heat dissipated by the heat generating electronic components 110 of each daughter board 100 and enters the second liquid distribution manifold 700 as hot liquid. The second liquid distribution manifold 700 causes the hot liquid to exit the system via the liquid line 600 at the top of the figure. Cool liquid is continually provided to the first liquid distribution manifold 700 such that the hot liquid in the additional liquid lines 710 is replaced with cool liquid. As a result, the interior temperature of the power instrument can be maintained at a level that does not adversely impact operation of the instrument.

The disclosed system provides several advantages over conventional systems. For example, by using identical daughter boards, a new design version of the power instrument may be easily implemented. A user need only replace each daughter board with a new set of modified daughter boards in order to upgrade the power instrument. The mother board and other instrument components need not be replaced.

While the invention has been particularly shown and described with reference to a specific embodiment thereof, it will be understood by those skilled in the art that the foregoing and other changes in the form and details may be made therein without departing from the spirit or scope of the invention. For example, the interior of the power instrument can be maintained at a temperature that does not adversely affect instrument operation using a liquid cooling system rather than a heatsink/fan combination. These and other equivalents and alternatives are intended to be included within the scope of the present invention. Therefore, the scope of this invention should not be limited to the embodiments described above, and should instead be defined by the following claims.

What is claimed is:

1. An instrument for providing motherboard electrical power at a motherboard output power connector, the instrument comprising:
    a mother board having a first input connector for receiving control signals, a second input connector for receiving input electrical power, and the motherboard output power connector;
    the mother board also includes a first path coupled to the first input connector for providing the control signals to a first set of connectors mounted on the mother board, a second path coupled to the second input connector for providing the input electrical power to a second set of connectors mounted on the mother board, and a third path connected to a third set of connectors mounted on the motherboard and connected to the motherboard output power connector;
    a plurality of daughter boards, each daughter board of the plurality of daughter boards including:
        a control signal connector coupled to one of the first set of connectors on the mother board,
        an input power connector coupled to one of the second set of connectors on the mother board, and
        a daughter board output power connector coupled to one of the third set of connectors on the mother board;
        power circuitry which receives the input electrical power from the input power connector and provides daughter board electrical power to the daughter board output power connector,
        control circuitry which in response to the control signals controls the power circuitry to provide the daughter board electrical power to the daughter board output power connector, and
        a heatsink affixed to the each daughter board;
    all of the plurality of daughter boards providing substantially a same amount of controlled daughter board electrical power to the mother board; and
    an apparatus for causing a flow of a cooling fluid to contact the heatsink of the each daughter board of the plurality of daughter boards.

2. The instrument as in claim 1 wherein the apparatus for causing the flow of the cooling fluid comprises a plurality of electrically operated fans, each electrically operated fan of the plurality of electrically operated fans disposed in proximity to a corresponding one of the plurality of daughter boards.

3. The instrument as in claim 1 wherein the apparatus for causing the flow of the cooling fluid includes a source of cooling liquid, a connector for providing the cooling liquid to the heatsink of the each daughter board, and a fluid passage in the heatsink of the each daughter board of the plurality of daughter boards through which the cooling liquid is circulated.

4. The instrument as in claim 1 wherein the third path comprises a copper trace on the mother board.

5. The instrument as in claim 4 wherein the copper trace is at least 7.5 centimeters wide and formed on an opposite side of the mother board from the third set of connectors.

6. The instrument as in claim 1 wherein the heatsink on the each daughter board of the plurality of daughter boards comprises:
an enclosed path extending along a length of the each daughter board and having a surface adapted to be coupled to the each daughter board;
a plurality of thermally conductive protrusions positioned to allow air to flow over the plurality of thermally conductive protrusions; and
the cooling fluid comprises the air.

7. The instrument as in claim 1 further comprising:
an enclosure having a surface upon which the mother board is mounted; and
the apparatus for causing the flow of the cooling fluid includes a plurality of electrically operated fans, each fan of the plurality of electrically operated fans being attached to the enclosure, and the each fan of the plurality of electrically operated fans being aligned to move air across the each heatsink on each of at least one daughter board of the plurality of daughter boards.

8. The instrument as in claim 7 further including openings in the enclosure to enable entry of ambient air and exit of heated air.

9. A power supply for providing controlled electrical power at an at a motherboard output power connector comprising:
a mother board having a first input connector for receiving control signals, a second input connector for receiving input electrical power, and the motherboard output power connector for providing the controlled electrical power;
the mother board also includes a first path coupled to the first input connector for providing the control signals to a first set of connectors mounted on the mother board, a second path coupled to the second input connector for providing the input electrical power to a second set of connectors mounted on the mother board, and a third path connected to the motherboard output power connector for providing daughterboard electrical power from a third set of connectors mounted on the mother board to the motherboard output power connector;
at least two daughter boards, each daughter board of the at least two daughter boards including:
a control signal connector coupled to one of the first set of connectors on the mother board,
an input power connector coupled to one of the second set of connectors on the mother board, and
a daughterboard output power connector coupled to one of the third set of connectors on the mother board;
power circuitry which receives the input electrical power from the input power connector and provides daughterboard electrical power to the daughterboard output power connector,
control circuitry which in response to the control signals controls the power circuitry to provide the daughterboard electrical power to the daughterboard output power connector; and
a heatsink affixed to a surface of the each daughter board, the heatsink including:
a base;
two side plates extending from opposite longitudinal edges of the base; and
a plurality of thermally conductive surfaces disposed between the two side plates and extending from the base, and
a heatsink connector opposite the base connecting the heatsink to the each daughter board,
wherein the each daughter board provides substantially a same amount of the daughter board electrical power to the mother board as others of the at least two daughter boards.

10. The power supply of claim 9 wherein the base, the two side plates and the heatsink connector of the heatsink provide an interior volume within which the plurality of thermally conductive surfaces are disposed.

11. The power supply of claim 10 further comprising a fan disposed to force air across the heatsink.

12. The power supply of claim 11 wherein the heatsink is thermally coupled to the power circuitry on the each daughter board.

13. The power supply of claim 9 further comprising a liquid cooling system which includes a flow passage thermally coupled to the power circuitry on the each daughter board.

14. The power supply as in claim 9 wherein the third path comprises at least one copper trace.

15. The power supply of claim 14 wherein the at least one copper trace is at least 7.5 centimeters wide.

16. The power supply as in claim 9 wherein the at least two daughter boards comprises a plurality of daughter boards mounted in a parallel arrangement on one side of the mother board.

17. A power supply comprising:
an enclosure having sides and a bottom;
a mother board having a mother board electrical output power connector coupled to at least one copper trace, the at least one copper trace is at least 7.5 centimeters wide on the mother board;
a plurality of daughter boards attached to the mother board, each daughter board of the plurality of daughter boards including substantially identical power circuitry and substantially identical control circuitry for providing substantially equal daughter board electrical power to the mother board, the plurality of daughter boards mounted in parallel on one side of the mother board;
the each daughterboard of the plurality of daughter boards including a heatsink coupled to the substantially identical power circuitry, the heatsink including a base, two side plates extending from opposite longitudinal edges of the base, and a plurality of thermally conductive protrusions extending from the base to define an air passage; and
a plurality of fans being disposed on the enclosure to force air through the enclosure to thereby cool the plurality of daughter boards.

* * * * *